(12) United States Patent
Tokito

(10) Patent No.: US 7,376,028 B2
(45) Date of Patent: May 20, 2008

(54) SEMICONDUCTOR MEMORY DEVICE AND METHOD FOR READING SEMICONDUCTOR MEMORY DEVICE

(75) Inventor: Shunsaku Tokito, Kanagawa (JP)

(73) Assignee: Sony Corporation (JP)

( * ) Notice: Subject to any disclaimer, the term of this patent is extended or adjusted under 35 U.S.C. 154(b) by 25 days.

(21) Appl. No.: 10/561,965

(22) PCT Filed: Jul. 5, 2004

(86) PCT No.: PCT/JP2004/009885

§ 371 (c)(1),
(2), (4) Date: Nov. 16, 2006

(87) PCT Pub. No.: WO2005/004165

PCT Pub. Date: Jan. 13, 2005

(65) Prior Publication Data

US 2007/0109895 A1    May 17, 2007

(30) Foreign Application Priority Data

Jul. 4, 2003    (JP)    ............... 2003-192396

(51) Int. Cl.
*G11C 7/00*    (2006.01)
(52) U.S. Cl. ............... 365/203; 365/200; 365/218
(58) Field of Classification Search ............ 365/185.2, 365/200, 203, 218
See application file for complete search history.

(56) References Cited

U.S. PATENT DOCUMENTS 5,903,575 A * 5/1999 Kikuda .................. 714/719
6,314,044 B1 * 11/2001 Sasaki et al. .......... 365/230.03
2007/0047349 A1 * 3/2007 Tokito ...................... 365/203

FOREIGN PATENT DOCUMENTS

| JP | 06-349280 | 12/1994 |
| JP | 09-128958 | 5/1997 |
| JP | 2001-521262 | 11/2001 |
| JP | 2001-351385 | 12/2001 |

OTHER PUBLICATIONS

International Search Report mailed Nov. 16, 2004.

* cited by examiner

*Primary Examiner*—Anh Phung
*Assistant Examiner*—Hien N Nguyen
(74) *Attorney, Agent, or Firm*—Rader Fishman & Grauer PLLC; Ronald P. Kananen

(57) ABSTRACT

A semiconductor memory device having a dummy memory cell and a reading method of the same, wherein provision is made of a memory cell 11 connected to a word line WL and a pair of bit lines BL and xBL, a dummy memory cell 12 connected to a word line WL and a pair of dummy bit lines DBL and xDBL, and a word line driver 13 for activating the word line at a common timing, and when the data is read out from the memory cell, a timing of the reading of the data is determined in accordance with a level of the dummy bit lines connected to the dummy memory, and when a voltage difference of a pair of dummy bit lines becomes a threshold voltage, the word line driver deactivates the word line and precharges the dummy bit lines.

14 Claims, 12 Drawing Sheets

DMC

DMC1(n+1)～DMCm(n+1)

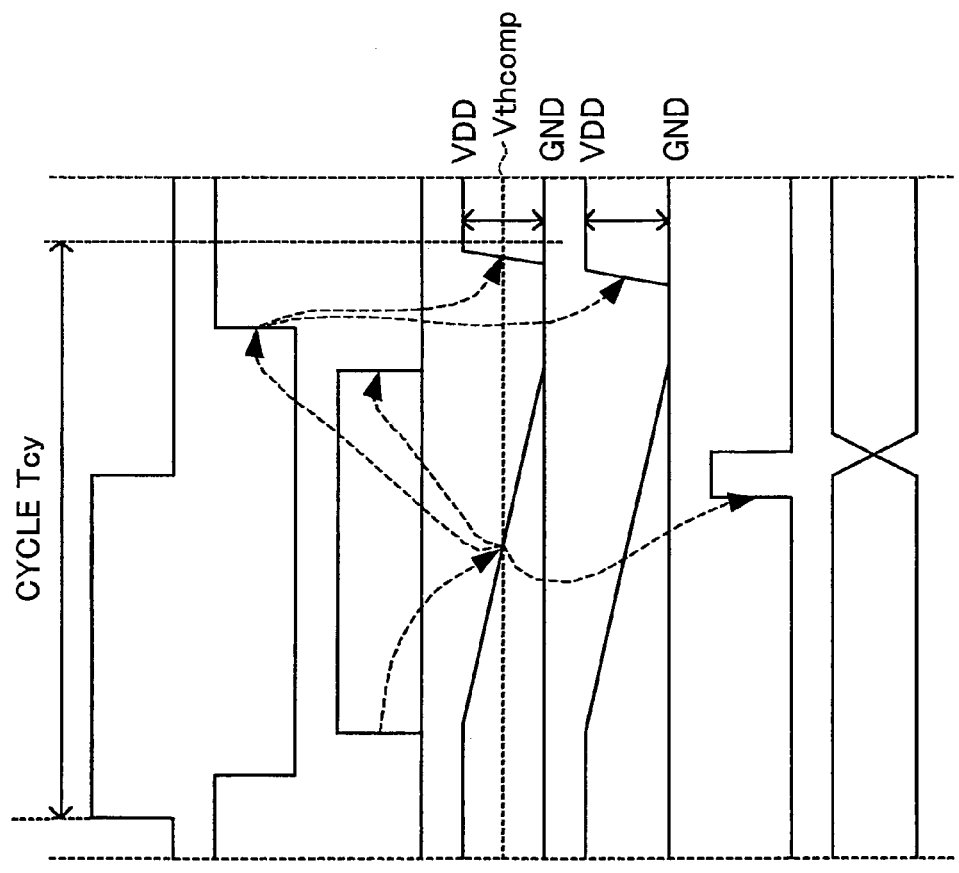

SEMICONDUCTOR MEMORY DEVICE AND METHOD FOR READING SEMICONDUCTOR MEMORY DEVICE

TECHNICAL FIELD

The present invention relates to a semiconductor memory device for reading data of a memory cell based on a timing signal of, for example, a dummy memory cell and a method for reading the semiconductor memory device.

BACKGROUND ART

A semiconductor memory such as an SRAM (static random access memory) or ROM (read only memory), having a dummy memory cell and reading the data of a memory cell based on the timing signal of the dummy memory cell, is known.

FIG. 11 is a functional block diagram of a semiconductor memory device provided with a general dummy memory cell. FIGS. 12A to 12G are timing charts of the semiconductor memory device shown in FIG. 11. A simple explanation will be given on a read operation of a SRAM, ROM, or other semiconductor memory device provided with a general dummy memory cell DMC with reference to FIG. 11 and FIGS. 12A to 12G.

A signal S182b is output to a predecoder 16 by an internal timing control circuit 18b. When a predetermined word line WL is activated as shown in FIG. 12C by the predecoder 16 and a word line driver 13b, bit lines BL and xBL (xBL indicates an inverted BL), connected to a memory cell MC, as shown in FIG. 12E, and dummy bit lines DBL and xDBL, connected to a dummy memory cell DMC, as shown in FIG. 12D, are discharged.

A comparator unit 14 compares potentials of the dummy bit lines DBL and xDBL, as shown in FIG. 12D. When, for example, a voltage difference is a previously set threshold voltage Vthcomp or less, it outputs a signal S14 as the timing signal via a timing signal line TL to the internal timing control circuit 18b.

This timing signal line TL is formed longer than one side length of one row of memory cells 11 from the comparator unit 14 to the internal timing control circuit 18b via a sense amplifier 19 etc. when components are arranged, as shown in, for example, FIG. 14.

The internal timing control circuit 18b outputs a pulse signal S181b based on the signal S14 input via the timing signal line TL, as shown in FIG. 12F, makes the sense amplifier 19 read out the data of the predetermined memory cell MC via the bit lines BL and xBL, as shown in FIG. 12G, and then outputs the signal S182b to make the predecoder 16 and the word line driver 13b deactivate the word line WL, as shown in FIG. 12C, and outputs a signal S183b to make a precharge circuit 15b precharge the predetermined bit lines BL and xBL and dummy bit lines DBL and xDBL to the predetermined potential, as shown in FIGS. 12D and 12E.

In the above reading method, however, after the internal timing control circuit 18b receives the timing signal S14 via the timing signal line TL, the dummy bit lines DBL and xDBL, connected to the dummy memory cell DMC, are precharged; therefore, a start time of the precharge is delayed, so there is a problem of a long cycle time.

Further, the deactivation of the word line WL of the memory cell MC is slow. Therefore, the bit lines BL and xBL of the memory cell MC repeat a precharge and discharge operation in each cycle from a (voltage) power source Vcc to a reference voltage GND, so there is a problem that excessive power is consumed.

Japanese National Publication (Kohyo) No. 2001-521262 discloses a memory circuit in which a dummy memory cell for approximating an RC (resistor-capacitor) delay of a core cell is connected to a word line folded so that a terminal end is provided at a position close to the word line driver in order to shorten the cycle time of the memory.

Further, Japanese National Publication (Kohyo) No. 2001-521262 discloses a memory system in which overlapped columns and a padding column are formed adjacent to the memory cells.

For example, in the memory circuit disclosed in Japanese National Publication (Kohyo) No. 2001-521262, the dummy memory cell is connected to the word line folded so that the terminal end is provided at a position close to the word line driver, a standard delay time is set by a delay time of the RC along with the word line connected to the dummy memory cell, and the read processing is carried out based on the standard delay time, but the precharge etc. of the dummy bit line connected to the dummy memory cell are not controlled and the cycle time due to the precharge is not improved.

For example, in the memory system shown in Japanese Unexamined Patent Publication No. 2001-351385, the "ON" state of the sense amplifier is controlled based on the timing signal (also referred to as a self count control signal) by the overlapped columns and padding column, and the self count control signal is input from the overlapped columns and padding column to the predecoder via a long distance signal line. This signal line is long, therefore the resistance of the signal line becomes large. At the same time, a stray capacitance generated between an interconnect and an inter-layer film is large. Therefore, the time constant of the CR generated by this becomes large. As a result, the transmission characteristics of the signal, particularly the rise and fall (time) of the pulse waveform become slow. This will exert an influence upon the signal transmission. Namely, a delay occurs due to the distance of the signal line, so there is a problem of a long cycle time.

DISCLOSURE OF THE INVENTION

An object of the present invention is to provide a semiconductor memory device for generating a timing signal by a dummy memory cell able to shorten the cycle time for reading without depending upon the precharge time of the dummy bit line connected to the dummy memory cell and a reading method of the semiconductor memory device.

Further, another object of the present invention is to provide a semiconductor memory device able to suppress the power consumption due to the precharge and discharge of bit lines and a reading method of the semiconductor memory device.

According to a first aspect of the present invention, there is provided a semiconductor memory device comprising a first data holding circuit specified by driving a control line and a first data supply line; a second holding circuit specified by driving the control line and a second data supply line and provided at a position adjacent to the first data holding circuit; a comparison circuit for detecting an output level of the second data holding circuit and generating a timing signal in accordance with a result of comparison between this detection result and a threshold voltage; and a drive circuit for driving the first control line in accordance with the timing signal of the comparator when reading the data from the first data holding circuit.

According to a second aspect of the present invention, there is provided a semiconductor memory device comprising a first data holding circuit specified by driving a first control line and a first data supply line; a second holding circuit specified by driving a second control line and a second data supply line and provided at a position adjacent to the first data holding circuit; a first comparison circuit for detecting an output level of the second data holding circuit and generating a timing signal in accordance with a result of comparison between this detection result and a threshold voltage; a first drive circuit for driving the first control line in accordance with the timing signal of the first comparator when reading the data from the first data holding circuit; a second comparison circuit for detecting the level of the second control line, comparing this detection result and the threshold voltage, and generating a second timing signal in accordance with the result; and a second drive circuit for driving the second control line in accordance with the timing signal of the second comparator when reading the data from the first data holding circuit.

According to a third aspect of the present invention, there is provided a semiconductor memory device having a first memory cell connected to a word line and a pair of first bit lines, a second memory cell connected to the word line and a pair of second bit lines, and a word line driver activating at least the word line at a common timing and determining the timing of the reading of the data in accordance with the level of the second bit line connected to the second memory cell when data is read out from the first memory cell, wherein the word line driver deactivates at least the word line connected to the second memory cell and precharges the second bit line connected to the second memory cell to the predetermined potential when the voltage difference of the pair of second bit lines becomes a previously set value.

According to a fourth aspect of the present invention, when the data is read out from the first memory cell, the timing of the reading of the data is determined in accordance with the level of the second bit line connected to the second memory cell.

In the word line driver, when the voltage difference of a pair of second bit lines becomes the previously set value, at least the word line connected to the second memory cell is deactivated and the second bit line connected to the second memory cell is precharged to the predetermined potential.

Further, according to a fifth aspect of the present invention, there is provided a semiconductor memory device comprising a first memory cell connected to a word line and a pair of first bit lines; a sense amplifier connected to the first bit lines; a first precharge circuit for precharging the first bit lines to a predetermined potential; a second memory cell connected to the word line and a pair of second bit lines; a first comparator unit for comparing potentials of the pair of second bit lines and generating a timing signal when the voltage difference becomes a previously set value; a word line driver connected to the word line and the pair of second bit lines and precharging the second bit lines to the predetermined potential based on at least the potential of the word line; and a control circuit for making the word line driver activate the word line in a state where the first bit lines and the second bit lines are precharged to discharge the first bit lines and the second bit lines, making the sense amplifier detect the voltage difference of the first bit lines based on the timing signal output from the first comparator unit when the voltage difference of the pair of second bit lines becomes the previously set value, and making the first precharge circuit precharge the first bit lines to the predetermined potential, wherein the word line driver includes a second comparator unit for comparing the potentials of the pair of second bit lines and generating the timing signal when the voltage difference becomes the previously set value, a word line control unit for deactivating the word line connected to the second memory cell based on at least the timing signal generated by the second comparator unit, and a second precharge circuit for precharging the pair of second bit lines connected to the second memory cell to a predetermined potential when the word line becomes deactive.

Further, according to a sixth aspect of the present invention, there is provided a semiconductor memory device comprising a first memory cell connected to a first word line and a pair of first bit lines; a sense amplifier connected to the first bit lines; a first precharge circuit for precharging the first bit lines to a predetermined potential; a first word line driver connected to the first word line and activating and deactivating the first word line; a second memory cell connected to the second word line and a pair of second bit lines; a first comparator unit for comparing the potentials of the pair of second bit lines and generating a timing signal when the voltage difference becomes the previously set value; a second word line driver connected to the second word line and the pair of second bit lines and precharging the second bit lines to the predetermined potential based on the potential of at least the second word line; and a control circuit for making the word line driver activate the word line in a state where the first bit lines and the second bit lines are precharged to discharge the first bit lines and the second bit lines, making the sense amplifier detect the voltage difference of the first bit lines based on the timing signal output from the first comparator unit when the voltage difference of the pair of second bit lines becomes the previously set value, and making the first precharge circuit precharge the first bit lines to the predetermined potential, wherein the second word line driver includes a second comparator unit for comparing the potentials of the pair of second bit lines and generating the timing signal when the voltage difference becomes the previously set value, a word line control unit for deactivating the second word lines connected to the second memory cell based on the timing signal generated by at least the second comparator unit, and a second precharge circuit for precharging the pair of second bit lines connected to the second memory cell to the predetermined potential when the second word line becomes deactive.

Further, according to a seventh aspect of the present invention, there is provided a reading method of a semiconductor memory device having a first memory cell connected to a word line and a pair of first bit lines, a second memory cell connected to a word line and a pair of bit lines, and a word line driver deactivating at least the word line at a common timing, wherein when the data is read out from the first memory cell, the timing of reading of the data is determined in accordance with the level of the second bit lines connected to the second memory cell, and when the voltage difference of the pair of second bit lines becomes the previously set value, the word line driver deactivates at least the word line connected to the second memory cell to precharge the second bit lines connected to the second memory cell to the predetermined potential.

BRIEF DESCRIPTION OF THE DRAWINGS

FIGS. 12A to 12G are timing charts of the general semiconductor memory device shown in FIG. 11.

BEST MODE FOR WORKING THE INVENTION

Preferred embodiments of the present invention will be explained with reference to attached drawings.

Figure 1:
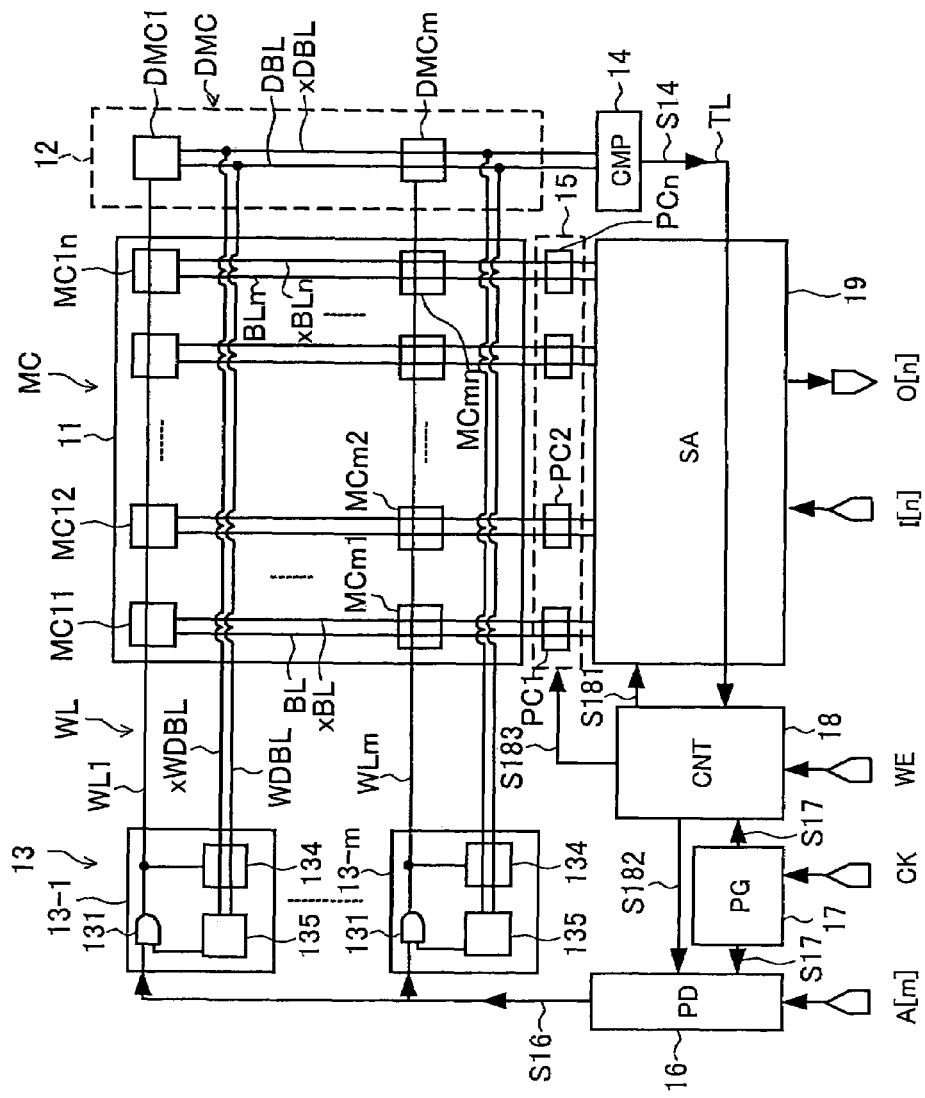
FIG. 1 is a block diagram showing a first embodiment of a semiconductor memory device according to the present invention.

FIG. 1 is a block diagram showing a first embodiment of a semiconductor memory device according to the present invention. A semiconductor memory device 1 according to the present embodiment has a dummy memory cell. When reading the data from the memory cell, it determines the timing of the reading of the data in accordance with the level (also referred to as the potential) of the dummy bit line connected to the dummy memory cell.

In more detail, based on the timing signal output when the voltage difference of the dummy bit lines connected to the dummy memory cell becomes the previously set threshold voltage at the time of the discharge, the read timing of the data from the memory cell is controlled, then the activation time of the word line and the timing start time of the precharge of the dummy bit lines to which the dummy cell is connected to the predetermined potential are controlled.

The semiconductor memory device 1 according to the present embodiment has, for example, as shown in FIG. 1, a memory cell 11, a dummy memory cell 12, a word line driver 13, a comparator unit 14, a precharge circuit 15, a predecoder 16, a pulse (signal) generating unit 17, an internal timing control circuit 18, and a sense amplifier 19.

In the present embodiment, for example, components are formed on the same IC (integrated circuit) chip.

The memory cell 11 corresponds to the first memory cell according to the present invention, the dummy memory cell 12 corresponds to the second memory cell according to the present invention, and the word line driver 13 corresponds to the word line driver according to the present invention.

In the memory cell 11, a plurality of memory cells MC11 to MCmn, for example, SRAM cells or ROM cells are formed in a matrix, memory cells MC1n, . . . , MCmn belonging to the same column are connected to a pair of bit lines BLn and xBLn, and these bit lines BLn and xBLn are connected via the precharge circuit 15 to the sense amplifier 19. The pair of bit line BL and inverted bit line xBL (xBL indicates the inverted bit of the BL) correspond to the first bit lines according to the present invention.

In the present embodiment, dummy memory cells (DMC1, DMC2, . . . , DMCm) are provided for each row in addition to a normal memory cell 11, and as a result dummy memory cells (DMC1 to DMCm) 12 of one column are configured.

Figure 2:
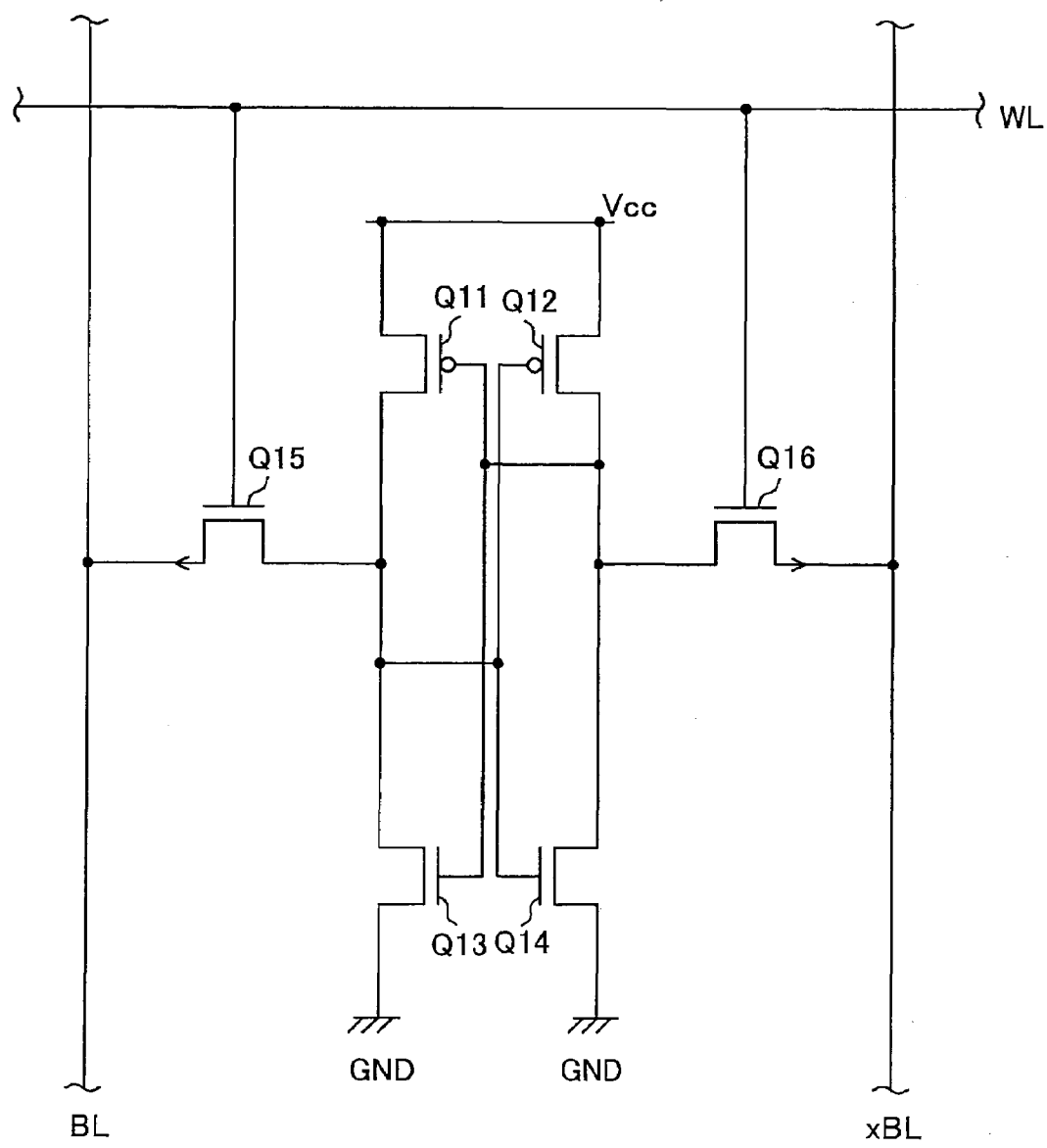
FIG. 2 is a cell circuit diagram showing a specific example of a memory cell of the semiconductor memory device shown in FIG. 1.

FIG. 2 is a cell circuit diagram showing a specific example of a memory cell of the semiconductor memory device shown in FIG. 1.

In the present embodiment, a case where the memory cell 11 is the SRAM cell, as shown in, for example, FIG. 2 will be explained.

For example, the memory cell MC is configured by, as shown in FIG. 2, p-channel MOS (metal oxide semiconductor) transistors Q11 and Q12 and N-channel MOS transistors Q13 to Q16.

The word line WL is connected to gates of the transistors Q15 and Q16. A complementary pair of bit lines BL and xBL are connected to drains of the transistors Q15 and Q16.

The transistors Q11 and Q13 are connected in series to a supply line of a (voltage) power source Vcc and a reference voltage GND, and transistors Q12 and Q14 are connected in series to the supply line of the (voltage) power source Vcc and the reference voltage GND.

Gates of the transistors Q11 and Q13 are connected to the source of the transistor Q16, and gates of the transistors Q12 and Q14 are connected to the source of the transistor Q15.

The dummy memory cell 12 is adjacent to the memory cell 12, for example, as shown in FIG. 2, and dummy memory cells DMC1 to DMCm having the same number as that of one column of memory cells 12 are formed.

To each of the dummy memory cells 12, a pair of dummy bit lines DBL and xDBL are connected. The dummy bit lines DBL and xDBL are connected to the comparator unit 14.

Figure 3:
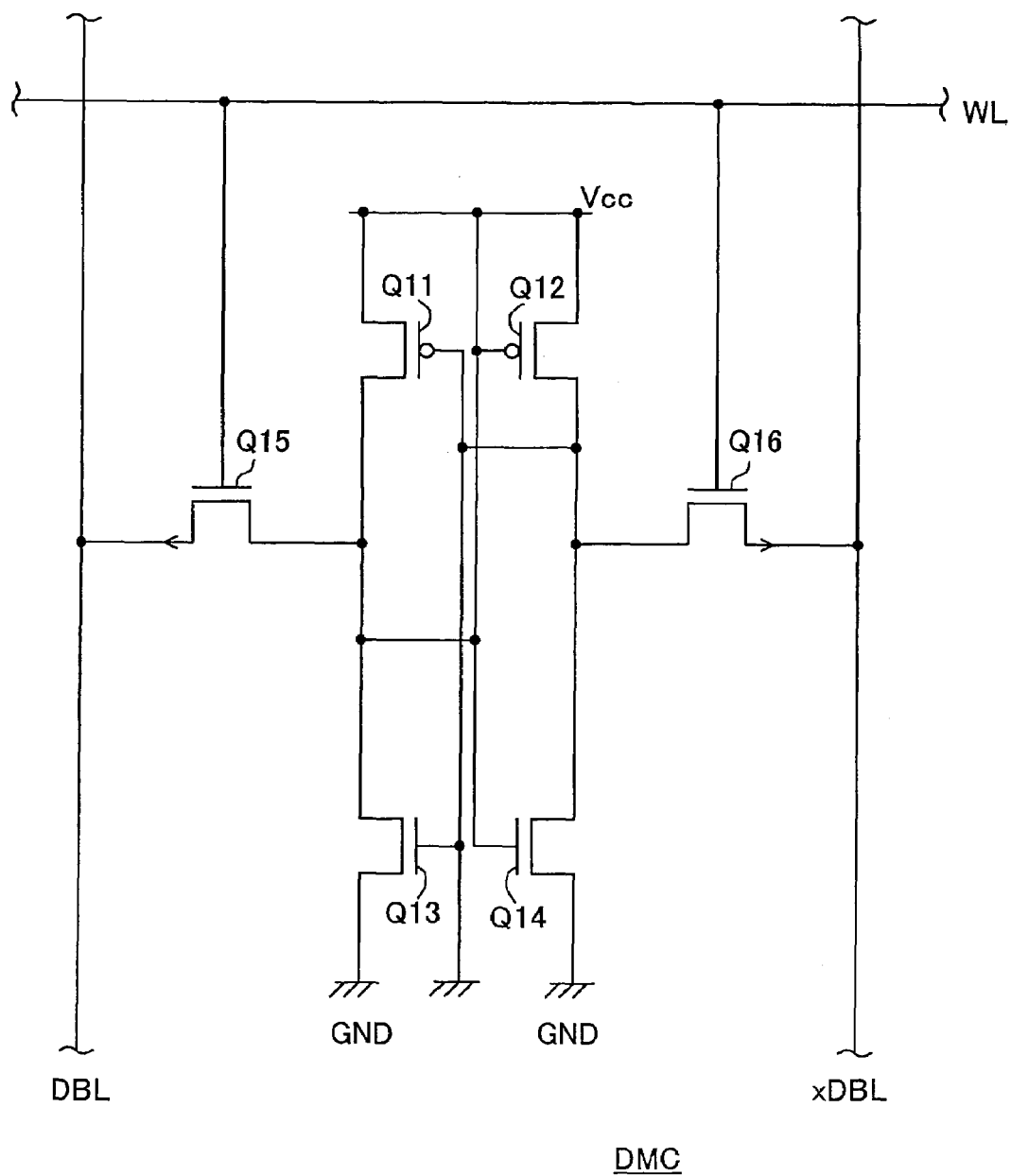
FIG. 3 is a cell circuit diagram showing a specific example of a dummy memory cell shown in FIG. 1.

FIG. 3 is a cell circuit diagram showing a specific example of the dummy memory cell shown in FIG. 1. The dummy memory cell 12 has almost the same configuration as that of the memory cell MC, for example, as shown in FIG. 3. The difference resides in the point that the bit lines BL and xBL shown in FIG. 2 are changed to the dummy bit lines DBL and xDBL and the point that the gate of the transistor Q11 is connected to the reference voltage and the gate of the transistor Q12 is connected to the supply line of the (voltage) power source Vcc.

The memory cell 11 and the dummy memory cell 12 of each row are connected to the common word lines WL1, . . . , WLm and driven by the word line driver 13.

The word line driver 13 and the dummy bit lines DBL and xDBL are connected by word dummy bit lines WDBL and xWDBL formed parallel along the word line WL via the memory cell 11 as shown in, for example, FIG. 1. The dummy bit lines DBL and xDBL correspond to the second bit lines according to the present invention.

Figure 4:
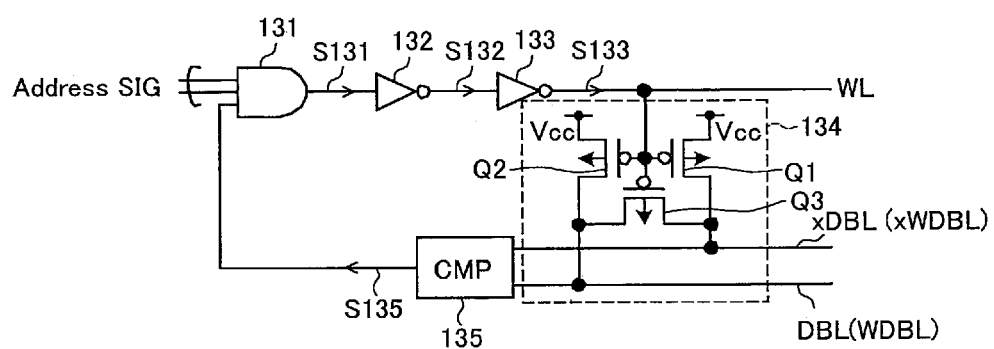
FIG. 4 is a functional circuit diagram of a word line driver of the semiconductor memory device shown in FIG. 1.

FIG. 4 is a functional circuit diagram of the word line driver of the semiconductor memory device shown in FIG. 1.

The word line driver 13 controls the activation time of the word line WL connected to the dummy memory cell 12 based on the timing signal by the dummy memory cell 12 and controls the precharge time of the dummy memory cell 12 based on the timing signal and the potential of the word line WL connected to the dummy memory cell 12.

In more detail, when the voltage difference of the pair of dummy bit lines DBL and xDBL becomes the previously set threshold voltage, the word line driver 13 deactivates at least the word line WL connected to the dummy memory cell 12 and precharges the dummy bit lines DBL and xDBL connected to the dummy memory cell 12.

The word line driver 13 has, for example, in more detail, as shown in FIG. 4, an AND logic gate circuit 131, inverters 132 and 133, a precharge circuit 134, and a comparator unit 135.

The AND logic gate circuit 131 corresponds to the word line control unit according to the present invention, the precharge circuit 134 corresponds to the precharge circuit according to the present invention, and the comparator unit 135 corresponds to the comparator unit according to the present invention.

The AND logic gate circuit 131 controls the activation and deactivation of the word line WL connected to the dummy memory cell 12 based on the signal S16 output by the predecoder 16 and the result of comparison by the comparator unit 135.

For example, when the voltage difference of the pair of dummy bit lines DBL and xDBL becomes the previously set threshold voltage Vthcomp or less as a result of the comparison by the comparator unit 135, the AND logic gate circuit 131 deactivates at least the word line WL connected to the dummy memory cell 12.

In more detail, the AND logic gate circuit 131 generates a signal S131 based on the signal S16 output by the predecoder 16 and a signal S135 output by the comparator unit 135 and outputs the signal S131 to the inverter 132.

The inverter 132 logically inverts the signal S131 output by the AND logic gate circuit 131 and outputs the same as a signal S132 to the inverter 133.

The inverter 133 logically inverts the signal S132 output by the inverter 132 and outputs the same as a signal S133 to the word line WL.

The precharge circuit 134 precharges a pair of dummy bit lines DBL and xDBL connected to the dummy memory cell 12 to the predetermined potential based on the activation and deactivation of the word line WL connected to the dummy memory cell 12 by the AND logic gate circuit 131.

For example, when the word line WL is deactivated, the precharge circuit 134 precharges a pair of dummy bit lines DBL and xDBL connected to the dummy memory cell 12 to the predetermined potential.

In more detail, the precharge circuit 134 precharges and discharges the dummy bit lines DBL and xDBL to the predetermined potential based on the signal S133 output from the inverter 133.

The precharge circuit 134 has P-channel MOS (metal oxide semiconductor) transistors Q1 to Q3, as shown in FIG. 4.

Gates of the transistors Q1 to Q3 are connected to the word line WL. Sources of the transistors Q1 and Q2 are connected to the supply line of the (voltage) power source Vcc. The drain of the transistor Q1 is connected to the dummy bit line xDBL, and the drain of the transistor Q2 is connected to the dummy bit line DBL.

The drain and source of the transistor Q3 are connected to the dummy bit lines DBL and xDBL.

The comparator unit 135 compares the potentials of a pair of dummy bit lines DBL and xDBL connected to the dummy memory cell 12. In more detail, the comparator unit 135 generates the signal S135 based on the voltage difference of the dummy bit lines DBL and xDBL, that is, the word dummy bit lines WDBL and xWDBL, and outputs it to the AND logic gate circuit 131.

When the voltage difference of the dummy bit lines DBL and xDBL is the previously set threshold voltage Vthcomp or less, the comparator unit 135 outputs a signal S135 of the "Low" level, while when it is larger than the threshold voltage Vthcomp, it outputs a signal S135 of the "High" level.

The comparator unit 14 shown in FIG. 1 is connected to the internal timing control circuit 18 via the timing signal line TL. In the present embodiment, the timing signal line TL is formed longer than one side length of one row of the memory cell 11 from the comparator unit 14 to the internal timing control circuit 18 via the sense amplifier 19 etc. when the components are formed, as shown in, for example, FIG. 1.

The comparator unit 14 compares the potentials of a pair of dummy bit lines DBL and xDBL in the same way as the comparator unit 135 shown in FIG. 4, generates the timing signal S14 when the voltage difference becomes the previously set threshold voltage Vthcomp or less, and outputs it to the internal timing control circuit 18. In the precharge circuit 15, the precharge circuits PC1 to PCn are formed for each bit lines BL and xBL, and the precharge of the bit lines BL and xBL to the predetermined potential is carried out based on a signal S183 output from the internal timing control circuit 18.

The predecoder 16 decodes input address signals A[0] to A[m] and outputs the signal S16 to the word line driver 13 at the predetermined timing based on a timing signal S182 output by the internal timing control circuit 18.

Figure 5:
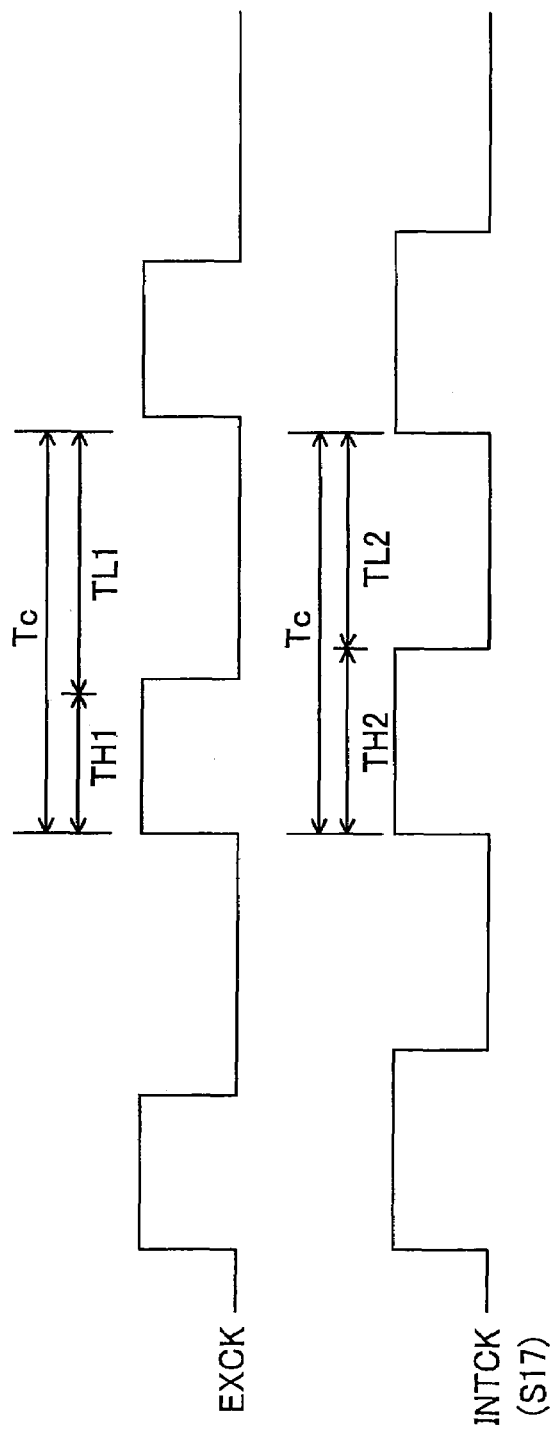
FIGS. 5A and 5B are waveform diagrams for explaining an operation of a pulse generating unit of the semiconductor memory device shown in FIG. 1.
Figure 6:
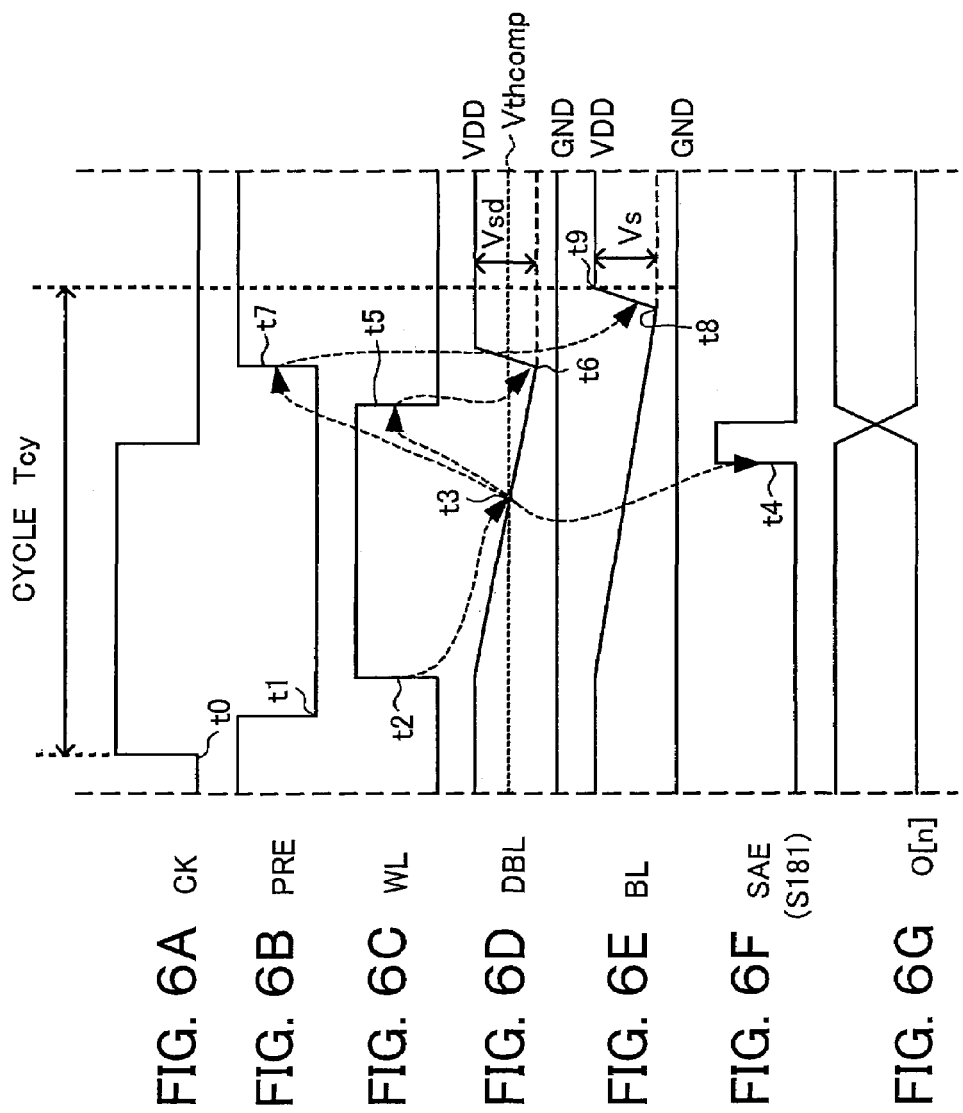
FIGS. 6A to 6G are timing charts for explaining the operation of the semiconductor memory device shown in FIG. 1.

FIGS. 5A and 5B are waveform diagrams explaining the operation of the pulse signal generating unit of the semiconductor memory device shown in FIG. 1.

When receiving as input an external clock CK (also referred to as an EXCK) of a period TH1 of the "High" level and a period TL1 of the "Low" level from the input terminal, for example, as shown in FIG. 5A, the pulse signal generating unit 17 outputs the internal clock signal CK (also referred to as INTCK) of a period TH2 of the "High" level longer than the period TH1 and a period TH2 of the "Low" level shorter than the period TL1 as a signal S17 to the predecoder 16 and the internal timing control circuit 18 etc., as shown in, for example, FIG. 5B.

The repetition cycles Tc of the external clock signal CK and the internal clock signal CK are the same, and the duty ratios are different.

The predecoder 16, the internal timing control circuit 18, etc. perform predetermined operations based on the internal clock signal CK.

The internal timing control circuit 18 is connected to an input terminal of a control signal WE, the precharge circuit 15, the predecoder 16, the pulse signal generating unit 17, and the sense amplifier 19.

The internal timing control circuit 18 decodes the control signal WE input from, for example, CPU (not shown) via the input terminal and outputs a signal S181 (sense amplifier enable signal: SAE) for amplifying the data on the bit lines BL and xBL to the sense amplifier 19.

Further, the internal timing control circuit 18 decodes the control signal WE, makes the predecoder 16 and the word line driver 13 decode the address signals A[0] to A[m], and outputs the signal S182 for activating and deactivating the word line WL.

Further, the internal timing control circuit 18 outputs the signal S183 for making the precharge circuit 15 precharge the bit lines BL and xBL.

The sense amplifier 19 amplifies data having a fine amplitude voltage on the bit lines BL and xBL based on the signal S181 from, for example, the internal timing control circuit 18 as mentioned above and outputs the data of the predetermined memory cell 12 as a data signal O[n] from an output terminal.

At the time of the data input, a data signal I[n] is input from the data input terminal and input to the bit lines BL and xBL.

FIGS. 6A to 6G are timing charts for explaining the operation of the semiconductor memory device shown in FIG. 1. An explanation will be given of the operation of the semiconductor memory device 1, particularly the operation of the word line driver 13, while referring to FIG. 1 to FIGS. 6A to 6G.

First, assume that the word line WL is in the deactive state at the "Low" level and that the bit lines BL and xBL and the dummy bit lines DBL and xDBL are precharged.

At a time t0, when the clock signal CK is set at the "High" level, as shown in FIG. 6A, the internal timing control circuit 18 outputs a precharge enable signal PRE (S183) to the precharge circuit 15, as shown in FIG. 6B (time t1).

At a time t2, the internal timing control circuit 18 outputs the signal S182 to the predecoder based on the control signal WE. The predecoder 16 and the word line driver 13 set the predetermined word line WL at the "High" level and activates the word line WL based on the address signal A[m] and the signal S182 as shown in FIG. 6C.

In more detail, as shown in FIG. 4, in the AND logic gate circuit 131, when the signal S135 of the "High" level is input from the comparator unit 135 and the signal S16 of the predetermined "High" level is input from the predecoder 16, the signal S131 of the "High" level is output, and the word line WL is set at the "High" level via the inverters 132 and 133 to activate the word line WL.

When the word line WL is activated, as shown in FIG. 6D, the dummy bit lines DBL and xDBL connected to the dummy memory cell 12 are discharged, and the bit lines BL and xBL connected to the memory cell 11 are discharged, as shown in FIG. 6E.

When detecting that the voltage difference of the dummy bit lines DBL and xDBL is the threshold voltage Vthcomp or less, at the time t3, as shown in FIG. 6D, the comparator unit 14 outputs the signal S14 of the "Low" level as the timing signal via the timing signal line TL to the internal timing control circuit 18. When the signal S14 is input, the internal timing control circuit 18 outputs the pulse signal S181 of the "High" level as the sense amplifier enable signal SAE to the sense amplifier 19, as shown in FIG. 6F (time t4).

The sense amplifier 19 reads out the data on the predetermined bit lines BL and xBL to which the data of the predetermined memory cell MC is output based on the pulse signal S181 and outputs it as the signal O[n], as shown in FIG. 6G.

On the other hand, at the time t3, as shown in FIG. 6D, when detecting that the voltage difference of the dummy bit lines DBL and xDBL is the threshold voltage Vthcomp or less, the comparator unit 135 of the word line driver 13 outputs the signal S135 of the "Low" level as the timing signal to the AND logic gate circuit 131.

When receiving as input the signal S135 of the "Low" level, the AND logic gate circuit 131 outputs the signal S131 of the "Low" level, sets the word line WL at the "Low" level, and deactivates the word line WL by the inverters 132 and 133, as shown in FIG. 6C (time t5).

In the precharge circuit 134 of the word line driver 13, at a time t5, when the word line WL is at the "Low" level, the transistors Q1 to Q3 become the "ON" state, and the dummy bit lines DBL and xDBL are precharged, as shown in FIG. 6D (time t6).

At this time, in the dummy bit lines DBL and xDBL, during the time t2 to t6 of the discharge, the potential of the dummy bit line DBL continuously becomes smaller, and at a time t6, the precharge to the predetermined potential is carried out and the voltage becomes the (voltage) power source Vcc before the potential of the dummy bit line DBL becomes 0.

For this reason, in the present embodiment, as shown in FIG. 6D, the dummy bit line DBL is precharged to a voltage Vsd smaller than the (voltage) power source Vcc.

At a time t7, as shown in FIG. 6B, in the internal timing control circuit 18, when the precharge enable signal PRE S183 of the "High" level is output to the precharge circuit 15, the precharge circuit 15 precharges the bit lines BL and xBL at a time t8, and the potential of the bit line BL is set at the (voltage) power source Vcc at a time t9.

At this time, the predetermined potential is precharged to before the voltage difference of the bit lines BL and xBL becomes 0 at the time t8, and it becomes the (voltage) power source Vcc. For this reason, in the present embodiment, as shown in FIG. 6E, the bit lines BL and xBL are precharged so that the voltage difference Vs is smaller than the (voltage) power source Vcc and precharged to the predetermined potential.

The cycle time Tcy is from the time t0 when the read operation starts to an end time t9.

As explained above, in the present embodiment, provision is made of a memory cell 11 connected to the word line WL and a pair of bit lines BL and xBL, a dummy memory cell 12 connected to the word line WL and a pair of dummy bit lines DBL and xDBL, and a word line driver 13 activating at least the word line WL at a common timing, where the data is read out from the memory cell 11, the timing of the reading of the data is determined in accordance with the level of the dummy bit lines DBL and xDBL connected to the dummy memory cell 12, and, when the voltage difference of the dummy bit lines DBL and xDBL becomes the previously set threshold voltage Vthcomp, the word line driver 13 deactivates at least the word line WL connected to the dummy memory cell 12 and precharges the dummy bit lines DBL and xDBL connected to the dummy memory cell 12 to the predetermined potential. Therefore, the precharge start time of the dummy bit lines DBL and xDBL becomes earlier than the precharge start time of the bit lines BL and xBL, and the cycle time Tcy of reading can be shortened without depending upon the precharge time of the dummy bit lines DBL and xDBL of the dummy memory cell 13.

In more detail, the bit lines BL and xBL connected to the memory cell 11 are precharged to the predetermined potential after the reading of the data is carried out by the sense amplifier 19 via the internal timing control circuit 18. On the other hand, in the dummy bit lines DBL and xDBL connected to the dummy memory cell 12, the word line WL which becomes the "Low" level and is deactivated by the comparator unit 135 inside the word line driver 13 precharges the dummy bit lines DBL and xDBL to the predetermined potential without waiting for the reading of the sense amplifier 19. Therefore, the cycle time Tcy can be shortened.

In more detail, the word line driver 13 is provided with a comparator unit 135 for comparing potentials of a pair of dummy bit lines DBL and xDBL connected to the dummy memory cell 12, an AND logic gate circuit 131 for controlling the activation and deactivation of the word line WL connected to the dummy memory cell 13 based on the result of the comparison by the comparator unit 135, and a precharge circuit 134 for precharging the pair of dummy bit lines DBL and xDBL connected to the dummy memory cell 12 to the predetermined potential when the word line WL connected to the dummy memory cell 12 is deactivated by the AND logic gate circuit 131. Therefore, the cycle time Tcy can be shortened.

Further, by making the activation time of the word line WL short, the power consumption due to the precharge and discharge of the bit lines BL and xBL connected to the memory cell 11 and the dummy bit lines DBL and xDBL to which the dummy memory cell 13 is connected can be suppressed.

Figure 7:
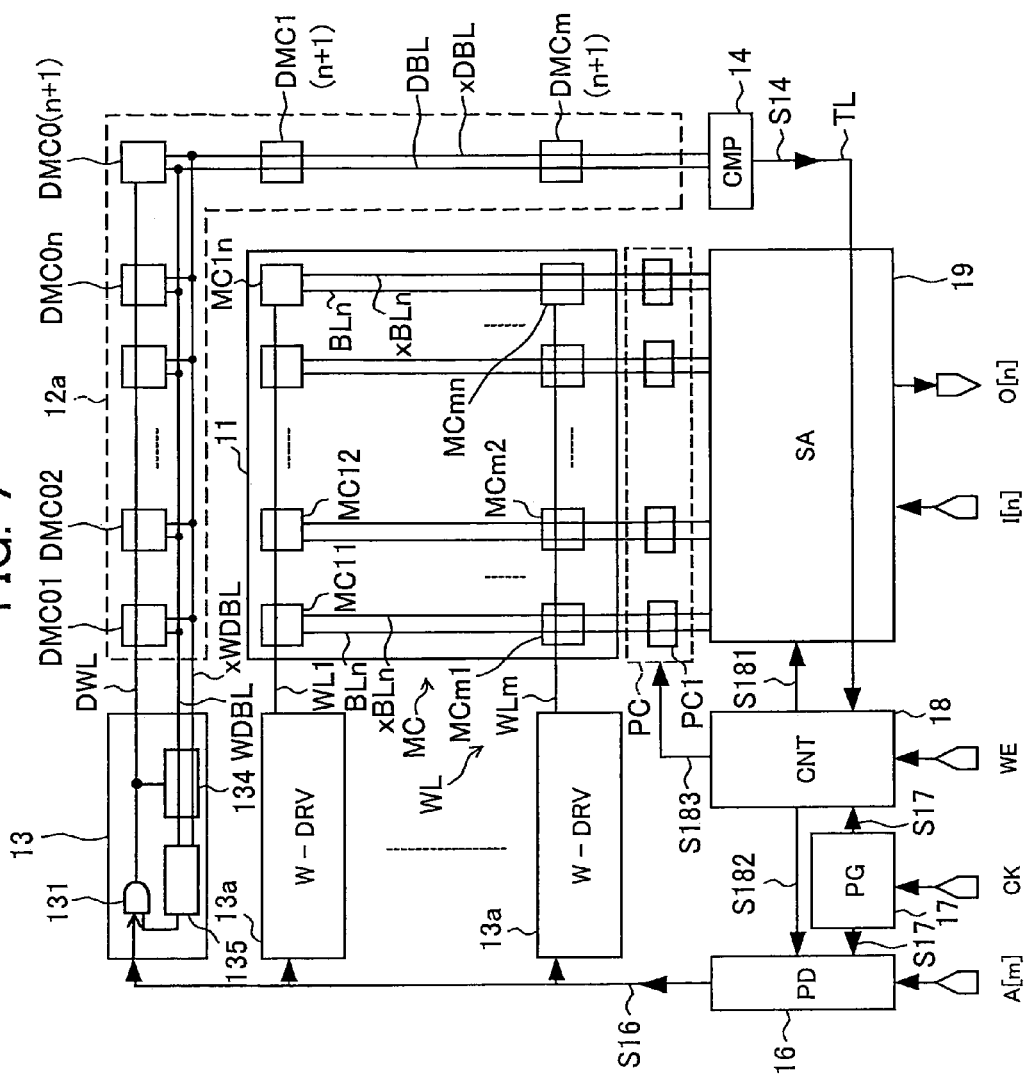
FIG. 7 is a block diagram showing a second embodiment of the semiconductor memory device according to the present invention.

FIG. 7 is a block diagram showing a second embodiment of the semiconductor memory device according to the present invention.

A semiconductor memory device 1a according to the present embodiment has substantially the same configuration as that of the semiconductor memory device 1 according to the first embodiment, so the same components are assigned the same notations and the explanations thereof will be omitted. Only the difference will be explained.

The difference between the first embodiment and the second embodiment resides in the point that a word line driver 13 for the dummy memory cell 12 and a word line 13a for the memory cell 11 are separately provided.

The word line driver 13 for the dummy memory cell 12a of the semiconductor memory device 1a shown in FIG. 7 is substantially the same as the word line driver 13 shown in FIG. 4. The word line WL may be read as the dummy word line DWL.

Figure 8:
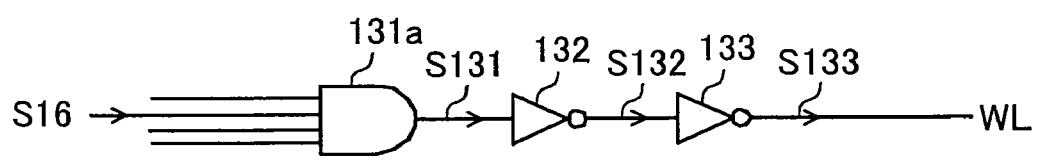
FIG. 8 is a functional circuit diagram of the word line driver of the semiconductor memory device shown in FIG. 7.

FIG. 8 is a functional block diagram of the word line driver 13a of the semiconductor memory device 1a shown in FIG. 7.

The word line driver 13a has, for example, as shown in FIG. 8, an AND logic gate circuit 131a and inverters 132 and 133.

The difference between the word line driver 13a and the word line driver 13 according to the first embodiment resides in a point that the precharge circuit and the comparator unit are not provided.

Further, the AND logic gate circuit 131a activates and deactivates the word line WL based on only the signal S16 from the predecoder 16.

In the semiconductor memory device 1a, one row and one column of dummy memory cells 12a are provided adjacent to the memory cell 11. In more detail, for example, as shown in FIG. 7, one row of dummy memory cells DMC01 to DMC0 (n+1) and one column of dummy memory cells DMC1(n+1) to DMCm(n+1) are provided.

The dummy memory cells DMC01 to DMC0(n+1) are connected by a common dummy word line DWL and are driven by the word line driver 13.

Figure 9:
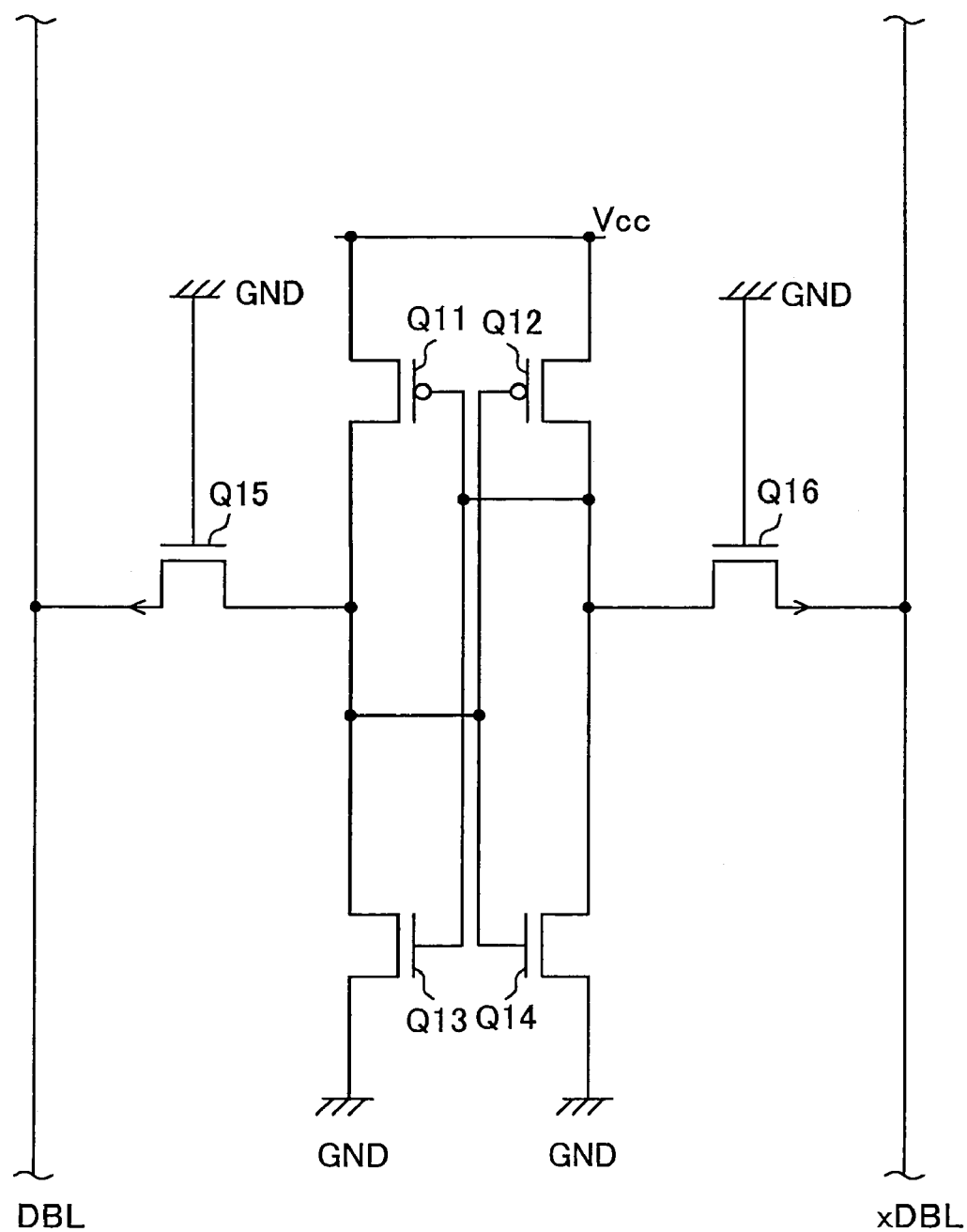
FIG. 9 is a functional circuit diagram enlarging a portion of the dummy memory cell of the semiconductor memory device shown in FIG. 7.

FIG. 9 is a functional circuit diagram enlarging a portion of the dummy memory cell of the semiconductor memory device 1a shown in FIG. 7.

The dummy memory cells DMC1(n+1) to DMCm(n+1), for example, are not connected to the dummy word line WL or word line WL, but a pair of dummy bit lines DBL and xDBL are commonly connected, and the word line WL is not connected.

The difference from the dummy memory cell DMC according to the first embodiment resides in a point that, in the dummy memory cells DMC1(n+1) to DMCm(n+1), for example, as shown in FIG. 9, gates of the transistors Q15 and Q16 are connected to the reference voltage GND.

Further, the word line driver 13 and the dummy bit lines DBL and xDBL are connected by the word dummy bit lines WDBL and xWDBL formed parallel along the dummy memory cells DMC01 to DMC0(n+1), as shown, in for example FIG. 1.

FIGS. 10A to 10G are timing charts for explaining the operation of the semiconductor memory device 1a shown in FIG. 7. The operation of the semiconductor memory device 1a will be explained focusing on the difference from the first embodiment while referring to FIG. 7 and FIGS. 10A to 10G.

As a large difference, in the semiconductor memory device 1a according to the present embodiment, the word line WL connected to the memory cell 11 and the dummy word line DWL to which the dummy memory cells DMC0 to DMC0(n+1) of the dummy memory cell 12a are connected are separately provided with word line drivers 13 and 13a, therefore, perform different operations.

First, assume that the word line WL is in the deactive state at the "Low" level, and the bit lines BL and xBL and the dummy bit lines DBL and xDBL are precharged.

Figure 10:
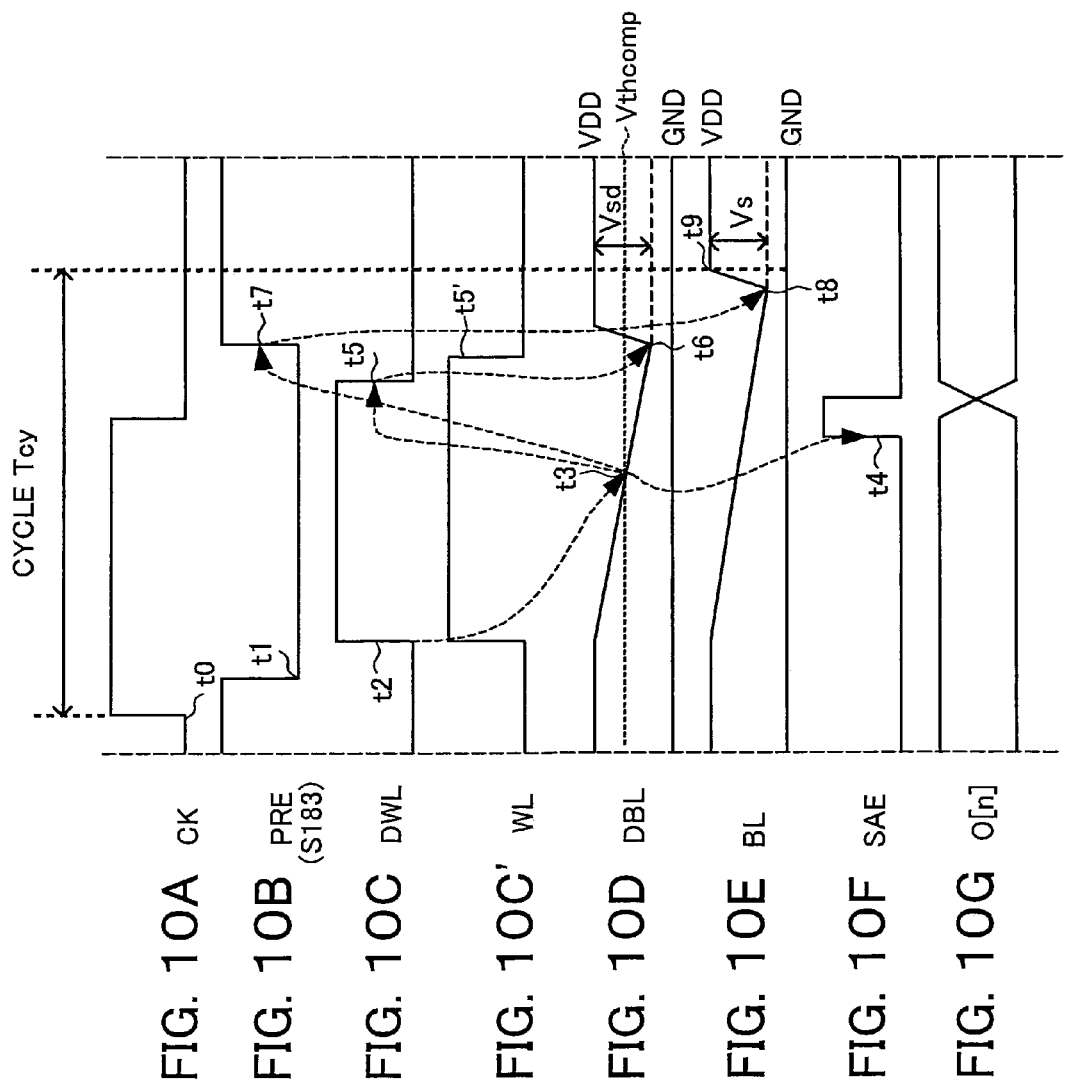
FIGS. 10A to 10G are timing charts for explaining the operation of the semiconductor memory device shown in FIG. 7.
Figure 11:
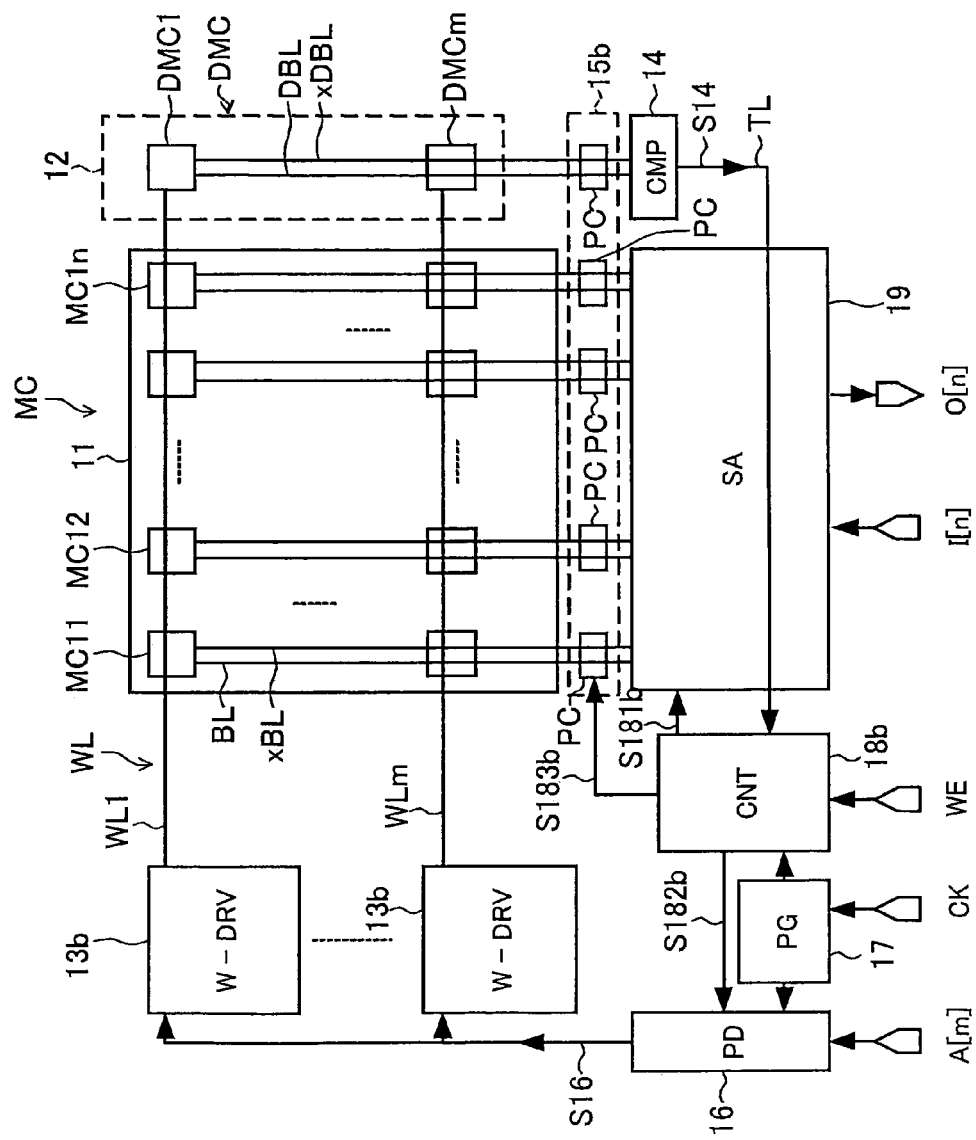
FIG. 11 is a functional block diagram of the semiconductor memory device provided with a general dummy memory cell.

At the time t0, when the clock signal CK is set at the "High" level as shown in FIG. 10A, the internal timing control circuit 18 outputs the precharge enable signal PRE (S183) of the "Low" level to the precharge circuit 15, as shown in FIG. 10B (time t1).

At the time t2, the internal timing control circuit 18 outputs the signal S182 to the predecoder 16 based on the control signal WE. The predecoder 16 and the word line driver 13a set the predetermined word line WL at the "High" level based on the address signal A[m] and the signal S182 and activates the word line WL, as shown in FIG. 10C'.

Further, the predecoder 16 and the word line driver 13 set the dummy word line DWL at the "High" level based on the address signal A[m] and the signal S182, as shown in FIG. 10C, and activate the dummy word line DWL.

In more detail, as shown in FIG. 4, when receiving as input the signal S135 of the "High" level from the comparator unit 135 and the predetermined "High" level signal S16 from the predecoder 16, the AND logic gate circuit 131 outputs the signal S131 of the "High" level and sets the dummy word line DWL at the "High" level via the inverters 132 and 133 (time t2).

When the dummy word line DWL is activated, as shown in FIG. 10D, the word dummy bit lines WDBL and xWDBL and the dummy bit lines DBL and xDBL connected to the dummy memory cell 12 are discharged.

Further, when the word line WL is activated, the bit lines BL and xBL connected to the memory cell 11 are discharged, as shown in FIG. 10E.

As shown in FIG. 10D, at the time t3, when detecting that the voltage difference of the dummy bit lines DBL and xDBL is the threshold voltage Vthcomp or less, the comparator unit 14 outputs the signal S14 of the "Low" level as the timing signal via the timing signal line TL to the internal timing control circuit 18. When the signal S14 is input, the internal timing control circuit 18 outputs the pulse signal S181 of the "High" level as the sense amplifier enable signal SAE to the sense amplifier 19, as shown in FIG. 10F (time t4).

The sense amplifier 19 reads out the data on the predetermined bit lines BL and xBL to which the data of the predetermined memory cell MC is output based on the pulse signal S181 and outputs it as the signal O[n], as shown in FIG. 10G.

On the other hand, at the time t3, when detecting that the voltage difference of the dummy bit lines DBL and xDBL is the threshold voltage Vthcomp or less, as shown in FIG. 10D, the comparator unit 135 of the word line driver 13 outputs the signal S135 of the "Low" level to the AND logic gate circuit 131a as the timing signal.

When receiving as input the signal S135 of the "Low" level, the AND logic gate circuit 131a outputs the signal S131 of the "Low" level, sets the dummy word line DWL at the "Low" level, and deactivates the dummy word line DWL, as shown in FIG. 10C, by the inverters 132 and 133.

On the other hand, when the comparator unit 14 detects that the voltage difference of the dummy bit lines DBL and xDBL, to which the dummy memory cells DMC0(n+1) to DMCm(n+1) are connected, is the threshold voltage Vthcomp or less, it outputs the signal S14 as the timing signal to the internal timing control circuit 18 via the timing signal line TL.

When receiving as input the signal S14, the internal timing control circuit 18 outputs the signal S182 to the predecoder 16 and makes the predetermined word line driver 13a set the word line WL to the "Low" level, that is, deactivate the word line WL (time t5')

In the precharge circuit 134 of the word line driver 13, at the time t5, when the word line WL is at the "Low" level, the transistors Q1 to Q3 become the "ON" state, and the word dummy bit lines WDBL and xWDBL and the dummy bit lines DBL and xDBL are precharged, as shown in FIG. 10D (time t6).

At this time, in the dummy bit lines DBL and xDBL, during the discharge time t2 to t6, the voltage difference of the dummy bit lines DBL and xDBL continuously becomes smaller, and at the time t6, the predetermined potential is precharged to the (voltage) power source Vcc before the potential between the dummy bit lines DBL and xDBL becomes 0.

For this reason, in the present embodiment, as shown in FIG. 10D, the dummy bit lines DBL and xDBL are precharged so that the voltage difference becomes Vsd or smaller than the (voltage) power source VDD.

As shown in FIG. 10B, at the time t7, when the internal timing control circuit 18 outputs the precharge enable signal PRE S183 of the "High" level to the precharge circuit 15, the precharge circuit 15 precharges the bit lines BL and xBL at the time t8, and the potential of the bit line BL is set at the (voltage) power source VDD at the time t9.

At this time, the predetermined potential is precharged to before the potential of the bit line BL becomes 0 at the time t8, and the voltage becomes the (voltage) power source Vcc. For this reason, in the present embodiment, as shown in FIG. 10E, the bit line BL is precharged to the potential Vs smaller than the (voltage) power source Vcc and precharged to the predetermined potential.

The cycle time is from the time t0 when the read operation starts to the end time t9.

As explained above, in the present embodiment, the word line driver 13 for the dummy memory cell 12a and the word line driver 13a for the memory cell 11 are separately provided. Therefore, by providing the dummy memory cell 12a and the word line driver 13 around, for example, the already existing memory cell 11, the invention can be accomplished without changing the memory cell 11.

Further, in the semiconductor memory device 1a according to the present embodiment, the comparator unit can be reduced in comparison with the first embodiment.

Further, by making the activation time of the dummy word line DWL short, the power consumption due to the precharge and discharge of the dummy bit lines DBL and xDBL, to which the dummy memory cell 13 is connected, can be suppressed.

Note that the present invention is not limited to the present embodiment and any of various preferred modifications are possible.

In the embodiment, the SRAM, ROM etc. were explained as the memory cell, but the present invention is not limited to this. For example, the present invention can be applied to the semiconductor memory device controlling the memory operation according to the timing signal by the dummy memory cell.

Further, in the embodiment, the dummy memory cell DMC was formed adjacent to the memory cell 11, but the position of forming the dummy memory cell DMC is not limited to this format. It is also possible that the timing signal for the read operation can be adequately output, and the precharge start time of the dummy bit lines DBL and xDBL can be controlled.

According to the present invention, a semiconductor memory device generating a timing signal by a dummy memory cell able to shorten the cycle time for reading without depending upon the precharge time of the dummy bit lines connected to the dummy memory cell and a reading method of a semiconductor memory device can be provided.

Further, according to the present invention, a semiconductor memory device able to suppress the power consumption due to the precharge and discharge of the bit lines and a reading method of the semiconductor memory device can be provided.

INDUSTRIAL CAPABILITY

As described above, a semiconductor memory device and a reading method of a semiconductor memory device according to the present invention can improve the read timing. Therefore, the present invention can be applied to semiconductor memory devices such as SRAMs, ROMs, and DRAMs.

The invention claimed is:

1. A semiconductor memory device comprising:
   a first data holding circuit specified by driving a control line and a first data supply line;
   a second holding circuit specified by driving the control line and a second data supply line and provided at a position adjacent to the first data holding circuit;
   a comparison circuit for detecting an output level of the second data holding circuit and generating a timing signal in accordance with a result of comparison between this detection result and a threshold voltage; and
   a drive circuit for driving the first control line in accordance with the timing signal of the comparator when reading the data from the first data holding circuit;
   further comprising a control circuit for deactivating a control line by said drive circuit in accordance with a timing signal of said comparison circuit and precharging to set the bias of said second data holding circuit to a predetermined level.

2. A semiconductor memory device as set forth in claim 1, wherein said control line is a word line and said first and second data supply lines are bit lines.

3. A semiconductor memory device as set forth in claim 1, providing said second data holding circuit for each said first data holding circuit.

4. A semiconductor memory device comprising:
- a first data holding circuit specified by driving a first control line and a first data supply line;
- a second holding circuit specified by driving a second control line and a second data supply line and provided at a position adjacent to the first data holding circuit;
- a first comparison circuit for detecting an output level of the second data holding circuit and generating a timing signal in accordance with a result of comparison between this detection result and a threshold voltage;
- a first drive circuit for driving the first control line in accordance with the timing signal of the first comparator when reading the data from the first data holding circuit;
- a second comparison circuit for detecting the level of the second control line, comparing this detection result and the threshold voltage, and generating a second timing signal in accordance with the result; and
- a second drive circuit for driving the second control line in accordance with the timing signal of the second comparator when reading the data from the first data holding circuit,
- further comprising a control circuit for deactivating a control line by said drive circuit in accordance with a timing signal of said first comparision circuit and precharging to set the bias of said second data holding circuit to a predetermined level.

5. A semiconductor memory device as set forth in claim 4, wherein said first and second control lines are word lines and said first and second data supply lines are bit lines.

6. A semiconductor memory device as set forth in claim 4, providing said second data holding circuit in a row direction and column direction of said first data holding circuit.

7. A semiconductor memory device having:
- a first memory cell connected to a word line and a pair of first bit lines,
- a second memory cell connected to the word line and a pair of second bit lines, and
- a word line driver activating at least the word line at a common timing and
- determining the timing of the reading of the data in accordance with the level of the second bit line connected to the second memory cell when data is read out from the first memory cell, wherein
- the word line driver deactivates at least the word line connected to the second memory cell and precharges the second bit line connected to the second memory cell to the predetermined potential when the voltage difference of the pair of second bit lines becomes a previously set value.

8. A semiconductor memory device as set forth in claim 7, wherein said word line driver includes a comparator unit connected to said pair of second bit lines and comparing the potentials of the pair of second bit lines, a word line control unit for deactivating the word line connected to at least the second memory cell when the potential difference of said pair of second bit lines becomes a previously set value as a result of the comparison by said comparator unit, and a precharge circuit for precharging the pair of second bit lines connected to the second memory cell to a predetermined potential when the word line connected to the said memory cell is deactivated by said word line control unit.

9. A semiconductor memory device as set forth in claim 7, wherein:
- said word line has said first memory cell, said second memory cell, and said word line driver connected in common to it, and
- said word line driver activates said word line at a common timing, deactivates said word line connected to said first and second memory cell when the potential difference of said pair of second bit lines becomes a previously set value, and precharges said second bit line connected to said second memory to a predetermined potential.

10. A semiconductor memory device comprising:
- a first memory cell connected to a word line and a pair of first bit lines;
- a sense amplifier connected to the first bit lines;
- a first precharge circuit for precharging the first bit lines to a predetermined potential;
- a second memory cell connected to the word line and a pair of second bit lines;
- a first comparator unit for comparing potentials of the pair of second bit lines and generating a timing signal when the voltage difference becomes a previously set value;
- a word line driver connected to the word line and the pair of second bit lines and precharging the second bit lines to the predetermined potential based on at least the potential of the word line; and
- a control circuit for making the word line driver activate the word line in a state where the first bit lines and the second bit lines are precharged to discharge the first bit lines and the second bit lines, making the sense amplifier detect the voltage difference of the first bit lines based on the timing signal output from the first comparator unit when the voltage difference of the pair of second bit lines becomes the previously set value, and making the first precharge circuit precharge the first bit lines to the predetermined potential, wherein
- the word line driver includes:
- a second comparator unit for comparing the potentials of the pair of second bit lines and generating the timing signal when the voltage difference becomes the previously set value,
- a word line control unit for deactivating the word line connected to the second memory cell based on at least the timing signal generated by the second comparator unit, and
- a second precharge circuit for precharging the pair of second bit lines connected to the second memory cell to a predetermined potential when the word line becomes deactive.

11. A semiconductor memory device comprising:
- a first memory cell connected to a first word line and a pair of first bit lines;
- a sense amplifier connected to the first bit lines;
- a first precharge circuit for precharging the first bit lines to a predetermined potential;
- a first word line driver connected to the first word line and activating and deactivating the first word line;
- a second memory cell connected to the second word line and a pair of second bit lines;
- a first comparator unit for comparing the potentials of the pair of second bit lines and generating a timing signal when the voltage difference becomes the previously set value;
- a second word line driver connected to the second word line and the pair of second bit lines and precharging the second bit lines to the predetermined potential based on the potential of at least the second word line; and a control circuit for making the word line driver activate the word line in a state where the first bit lines and the second bit lines are precharged to discharge the first bit lines and the second bit lines, making the sense amplifier detect the voltage difference of the first bit lines based on the timing signal output from the first comparator unit when the voltage difference of the pair of second bit lines becomes the previously set value, and making the first precharge circuit precharge the first bit lines to the predetermined potential, wherein the second word line driver includes:

a second comparator unit for comparing the potentials of the pair of second bit lines and generating the timing signal when the voltage difference becomes the previously set value, a word line control unit for deactivating the second word lines connected to the second memory cell based on the timing signal generated by at least the second comparator unit, and a second precharge circuit for precharging the pair of second bit lines connected to the second memory cell to the predetermined potential when the second word line becomes deactive.

12. A reading method of a semiconductor memory device having a first memory cell connected to a word line and a pair of first bit lines, a second memory cell connected to a word line and a pair of bit lines, and a word line driver deactivating at least the word line at a common timing, wherein when the data is read out from the first memory cell, the timing of reading of the data is determined in accordance with the level of the second bit lines connected to the second memory cell, and when the voltage difference of the pair of second bit lines becomes the previously set value, the word line driver deactivates at least the word line connected to the second memory cell to precharge the second bit lines connected to the second memory cell to the predetermined potential.

13. A reading method of a semiconductor memory device as set forth in claim 12, further comprising having a comparator unit in said word line driver connected to said pair of second bit lines compare the potentials of the pair of second bit lines, having a word line control unit in said word line driver connected to said second memory cell deactivate said word line when the potential difference of said pair of second bit lines becomes a previously set value as a result of the comparison by said comparator unit, and having a precharge circuit in said word line driver precharge the pair of second bit lines connected to the second memory cell to a predetermined potential when the word line connected to the second memory cell is deactivated by said word line control unit.

14. A reading method of a semiconductor memory device as set forth in claim 12, further having said word line have said first memory cell, said second memory cell, and said word line driver connected in common to it, and having said word line driver activate said word line at a common timing, deactivate said word line connected to said first and second memory cell when the potential difference of said pair of second bit lines becomes a previously set value, and precharge said second bit line connected to said second memory to a predetermined potential.

* * * * *